United States Patent
Busse et al.

(10) Patent No.: US 6,653,636 B2
(45) Date of Patent: Nov. 25, 2003

(54) SENSOR AND METHOD OF OPERATING THE SENSOR

(75) Inventors: Falko Busse, Aachen (DE); Michael Overdick, Langerwehe (DE); Walter Rütten, Kinnich (DE); Gerard Francis Harkin, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 370 days.

(21) Appl. No.: 09/773,130

(22) Filed: Jan. 31, 2001

(65) Prior Publication Data

US 2003/0146389 A1 Aug. 7, 2003

(30) Foreign Application Priority Data

Feb. 2, 2000 (DE) .......................... 100 04 490
Oct. 19, 2000 (GB) ............................. 0025621

(51) Int. Cl.$^7$ ............................. H01L 27/00
(52) U.S. Cl. .................. 250/370.09; 250/370.01
(58) Field of Search .................. 250/370.09, 214.1, 250/338.1, 338.4, 208.1; 348/302, 273, 308, 364, 241; 257/215, 291, 239, 222, 462, 290, 59, 292, 185, 225

(56) References Cited

U.S. PATENT DOCUMENTS 5,825,033 A    10/1998  Barrett et al. ............ 250/370.1
6,133,563 A  * 10/2000  Clark et al. ............... 250/208.1
2001/0013571 A1  *  8/2001  Kakumoto et al. ....... 250/208.1
2002/0043610 A1  *  4/2002  Lee et al. ................. 250/208.1

* cited by examiner

*Primary Examiner*—David Porta
*Assistant Examiner*—Christine Sung
(74) *Attorney, Agent, or Firm*—John Vodopia

(57) ABSTRACT

The invention relates to a sensor and a method of operating a sensor with includes a plurality of sensor elements (10), each of which includes a radiation-sensitive conversion element (1) which generates an electric signal in dependence on the incident radiation, and also with means (21 to 26) for amplifying the electric signal in each sensor element (10) and a read-out switching element (30) in each sensor element (10) which is connected to a read-out line (8) in order to read-out the electric signal. In order to provide a sensor in which a high stability of the transfer function and a favorable signal-to-noise ratio are ensured while maintaining a comparatively simple and economical construction, the means for amplifying include a respective source follower transistor (21) whose gate is connected to the conversion element (1), whose source is connected on the one side to an active load (23) and on the other side to one side of a sampling capacitor (26), the other side of the sampling capacitor (26) being connected to the read-out line (8) via the read-out switching element (30), a respective reset element (27) being connected to the conversion element (1) so as to reset the conversion element (1) to an initial state.

13 Claims, 5 Drawing Sheets

SENSOR AND METHOD OF OPERATING THE SENSOR

FIELD OF THE INVENTION

The invention relates to a sensor with a plurality of sensor elements, each of which includes a radiation-sensitive conversion element which generates an electric signal in dependence on the incident radiation, and also with means for amplifying the electric signal in each sensor element and a read-out switching element in each sensor element which is connected to a read-out line in order to read out the electric signal. The invention also relates to a method of operating such a sensor as well as to an X-ray examination apparatus which includes an X-ray source for emitting an X-ray beam for irradiating an object so as to form an X-ray image, as well as a detector for generating an electric image signal from said X-ray image.

BACKGROUND OF THE INVENTION

Large-surface X-ray detectors are customarily used for X-ray examination applications, notably in the medical field; such detectors consist of a plurality of sensor elements. The sensor elements (pixels) as a rule are arranged in rows and columns in a sensor matrix. Preferably, use is made of the so-called flat dynamic X-ray detectors (FDXD). Such detectors are seen as universal detector components that can be used in a wide variety of X-ray apparatus.

In contemporary FDXD embodiments, the individual sensor elements (matrix cells) comprise a radiation-sensitive conversion element, having an intrinsic storage capacity, and a switching element for reading out the signal present on the conversion element or the storage capacitance after the irradiation. The FDXD preferably utilize conversion elements in the form of photodiodes of amorphous silicon and scintillator elements connected thereto, or alternatively photoconductors, for the direct conversion of the X-rays into electric charges. In other types of sensors for other radiation, of course, other conversion elements can also be used.

Diode switches or transistors, notably TFTs (thin film transistors) of amorphous silicon are preferably used as read-out switching elements. In order to read out the signal, present as a collected charge on the conversion element or the intrinsic storage capacitance thereof, the read-out switching elements are activated and the collected charge is conducted to the relevant read-out line. From there it flows to a charge-sensitive amplifier (CSA). Subsequently, corresponding electronic information is applied to a multiplexer which conducts this information to a data acquisition unit for display on a display device in the form of a monitor.

When such detectors are used, notably in the medical analysis practice, it is desirable to reduce the radiation dose so as to limit the dose whereto the patient is exposed; consequently, only a very small amount of radiation is incident on the individual sensor elements. As a result, the electric signal in the individual sensor elements is also very small. Therefore, the aim is to realize sensors or X-ray detectors having an as high as possible signal-to-noise ratio.

A particularly high signal-to-noise ratio and detection of small doses, of course, is also desirable for other radiation-sensitive sensors. In order to improve the signal-to-noise ratio, the signal can in principle be amplified already in the individual matrix cell of the detector.

U.S. Pat. No. 5,825,033 discloses a semiconductor detector for gamma rays in which the charge generated in each pixel in the detector material is stored in an integration capacitor of a capacitive feedback amplifier. This integration takes place for all pixels simultaneously. In a so-called Correlated Double Sample-and-Hold circuit (CDSH) the noise induced by the resetting of the integration capacitor is eliminated. Subsequent to the CDSH, the individual pixels are connected to a respective unity gain buffer which is connected to a read-out line common to each column. The read-out lines are then combined by appropriate multiplexers. The sensor in this case consists of a matrix with 48×48 individual pixels.

For amplifier circuits for enhancing the signal-to-noise ratio, the signal amplification and the noise are customarily the essential characteristics considered for evaluation. For practical operation there is a further criterion in the form of the stability of the transfer function. For example, when the signal amplification or an offset value of the amplifier fluctuates in time, offset and gain artefacts occur in the imaging detector system; such artefacts can only be corrected partly and with great effort only. Such fluctuations may be caused by changes of the temperature or other operating conditions as well as be due to aging, radiation damage and/or trapping effects in semiconductors.

The threshold voltage and the transconductance are liable to change significantly in time, notably in the frequently used thin film transistors (TFTs) of amorphous silicon, which can also be used notably for the manufacture of integrated amplifier circuits in a matrix cell; this may degrade the stability of the transfer function.

Therefore, it is an object of the present invention to provide a sensor and a method of operating the sensor wherein a high stability of the transfer function and an attractive signal-to-noise ratio are ensured by a comparatively simple and economical construction.

SUMMARY OF THE INVENTION

This object is achieved by means of a sensor which is characterized in that the means for amplifying include a respective source follower transistor whose gate is connected to the conversion element, whose source is connected an active load and to one side of a sampling capacitor, the other side of the sampling capacitor being connected to the read-out line via the read-out switching element, and that a respective reset element is connected to the conversion element in order to reset the conversion element to an initial state.

The active load ideally constitutes a current source which impresses a constant channel current on the source follower transistor. The threshold voltage of the source follower transistor is thus stabilized; this threshold voltage is strongly dependent on the channel current, notably in the case of TFTs of amorphous silicon. As a result of the stable threshold voltage, the condition for correct operation of the source follower transistor with adequate stability of the transfer function is satisfied. Therefore, the source follower transistor has a stable voltage amplification of 1. It is converted into a charge amplification $G_Q = C_S / C_P$ by the sampling capacitor, wherein $C_P$ is the capacitance on the conversion element and $C_S$ is the capacitance of the sampling capacitor. The capacitance on the conversion element may again be an intrinsic storage capacitance of the conversion element or an additional capacitance.

Preferably, the active load, the read-out switching element and the reset element are also formed by transistors. All components required for the invention can then be integrated directly in the sensor elements while using the thin film technology which is used any way to form the sensor elements; in the context of this technology the transistors can be made of amorphous silicon or polycrystalline silicon. Because of the stable amplification circuit constructed in conformity with the invention, the use of the TFT transistors of amorphous silicon that can be economically manufactured is not a drawback.

A process with vertical integration can now be advantageously used in such a manner that the surface area of the conversion element, or the storage capacitance within a sensor element, is not reduced.

In one embodiment a discharge switching element, preferably in the form of a transistor, for example a TFT of amorphous or polycrystalline silicon, is connected parallel to the sampling capacitor. This discharge switching element can be used for the simultaneous, accelerated discharging of the sampling capacitor during a reset of the conversion element by means of the reset element, so that the sampling capacitor is also reset to an initial state.

The reset element and the discharge switching element may then have a common switching line so that they are always activated simultaneously. However, they may alternatively have separate switching lines, so that the reset element and the discharge switching element can be individually activated, for example for given modes of operation. Preferably, a plurality of sensor elements, for example all sensor elements of a row of the sensor matrix, have a common switching line for the activation of the read-out switching elements. Such sensor elements, connected to a common switching line, can also have common switching lines, or a common switching line for both elements, in order to activate the reset elements or the discharge switching elements.

According to a particularly advantageous method of operating a sensor according to the invention the conversion element and the sampling capacitor are reset to an initial state during a measuring and read-out cycle in each sensor element in a first phase. In a second phase a voltage difference which is representative of the conversion element in the initial state is then adjusted across the sampling capacitor. During a third phase the voltage across the sampling capacitor is sustained during irradiation of the conversion element by means of a radiation source whereas the voltage at the source output of the source follower is forced to change by the change of the signal at the conversion element or of its capacitance. Evidently, in this context the term irradiation by means of the radiation source is to be understood to mean not only direct irradiation by the radiation source, but also indirect irradiation, for example after transmission through an object to be examined. During a fourth phase the voltage difference across the sampling capacitor is adjusted to a value which is representative of the conversion element after the irradiation, the variation of the potential at the side of the sampling capacitor which is connected to the read-out line then being measured as a measure of the radiation incident on the conversion element. Preferably, the variation of the charge at the read-out side of the sampling capacitor is then recorded in a charge-sensitive amplifier (CSA). This means that the amount of charge flowing during the adjustment of the new voltage difference is integrated.

As a result of this switching sequence a so-called "correlated double sampling" (CDS) method is implemented in the relevant sensor element. This means that during the second phase a first sampling value is detected for the conversion element in the stationary state whereas during the fourth phase ultimately a value is measured across the sampling capacity which corresponds to the conversion element after the irradiation, only the difference between the initial state and the irradiated state being measured during the first sampling because of the bias in the second phase.

This switching process also offers the advantage that the reset operation during the first phase lies outside the time interval in which the conversion element is irradiated and the signal is read out, so that the reset operation has no effect on the measuring result and hence cannot contribute to the noise.

According to a second version of the method of the invention, a dark current is first detected on the conversion element during a first sub-phase of the second phase, the voltage difference across the sampling capacitor being held during a given time interval without irradiation of the conversion element by the radiation source while at the same time the voltage on the source output varies in conformity with the dark current occurring across the conversion element. The dark current can then be attributed essentially to leakage currents on the conversion element. This sub-phase is succeeded by a second sub-phase during which a voltage difference is adjusted across the sampling capacitor, which voltage difference corresponds to a reference state of the conversion element after the detection of the dark current. The second sub-phase is succeeded by a third sub-phase in which the conversion element is reset to its initial state, the voltage difference across the sampling capacitor then being maintained. The execution of the other phases is the same as in the previously described method.

The difference between this method and the previously mentioned mode of operation thus consists in that during the first sampling operation the initial state, that is, the off-load voltage on the conversion element, is not taken as the reference value, but the reference state already contains the integrated dark current. This means that the dark images are already buffered in the individual sensor elements and subtracted from the exposed images. Thus, the transfer and external storage of the dark images is dispensed with. Additionally, the usable dynamic range of the sensor is expanded, since the charges transferred from the individual sensor elements no longer contain a dark current component.

The adjustment of the voltage difference across the sampling capacitor during the second and the fourth phase is performed most easily by activation of the read-out switching element, that is, via the read-out line. In order to sustain the voltage difference during the third phase, or during the dark current measurement, the read-out switching element need only be deactivated.

The resetting of the sampling capacitor in one embodiment of the invention can be realized by activation of the discharge switching element connected parallel to the sampling capacitor, thus enabling accelerated resetting.

The measuring and read-out cycles can be controlled in common for each time a plurality of sensor elements and via common switching lines. That is, after the irradiation the sensor elements in a sensor matrix are successively read out in rows and are reset.

According to a third version of the method of the invention, there is provided a method of operating a sensor having a plurality of sensor elements (10) arranged in rows and columns, each of which includes a radiation-sensitive conversion element (1) which generates an electric signal in dependence on the incident radiation, a reset element (27) which resets the conversion element (1) to an initial state, and a source follower transistor (21) whose source is connected to an active load (23) and to one side of a sampling capacitor (26) whose other side is connected, via a read-out switching element (30), to a read-out line (8) for reading out the electric signal, the method comprising:

resetting the radiation-sensitive element and charging the sampling capacitor of each pixel to a known voltage;

exposing the sensor to radiation, the radiation-sensitive conversion element causing the voltage on the one side of the sampling capacitor to vary, wherein the read-out switching element is open during the exposure, providing an open circuit at the other side of the sampling capacitor, thereby maintaining a constant charge on the sampling capacitor; and closing the read out switching elements and charging the sampling capacitor for each pixel in a row to the voltage on the one side of the sampling capacitor, the amount of charge required being measured.

By separating the pixel resetting from the array readout phase, this scheme provides sufficient time for the sampling capacitor to reach a steady state which eliminates the pixel offset error charge. Furthermore, the pixel readout time can be increased.

According to a fourth version of the method of the invention, there is provided a method of operating a sensor having a plurality of sensor elements (10) arranged in rows and columns, each of which includes a radiation-sensitive conversion element (1) which generates an electric signal in dependence on the incident radiation, a reset element (27) which resets the conversion element (1) to an initial state, and a source follower transistor (21) whose source is connected to an active load (23) and to one side of a sampling capacitor (26) whose other side is connected, via a read-out switching element (30), to a read-out line (8) for reading out the electric signal, the method comprising:

exposing the sensor to radiation with the read-out switching elements closed, the radiation-sensitive conversion element causing a change in the voltage on the one side of the sampling capacitor and the read out line holding the other side of the sampling capacitor to a constant voltage;

closing the reset elements to and opening the read out switching elements, thereby holding the conversion element to a constant state irrespective of the incident radiation;

closing the read out switching elements of each row in turn and measuring the charge stored on the sampling capacitors for each row in turn.

Since the reset switches remain on during the readout period, the photodiode charge remains constant. Therefore, radiation incident on the detector after the exposure time will not alter the signal being readout through the sampling capacitors so that Frame Transfer operation is possible.

An X-ray examination apparatus according to the invention includes an X-ray source for emitting an X-ray beam for irradiating an object so as to form an X-ray image, as well as a detector for forming an electric image signal from said X-ray image, the X-ray detector being equipped with a sensor according to the invention. Such an X-ray examination apparatus has a particularly attractive signal-to-noise ratio and, therefore, is capable of operating with small doses, so that the radiation load for the object, notably a patient, can be kept small.

BRIEF DESCRIPTION OF THE DRAWINGS

Further details and advantages of the invention are disclosed in the dependent claims and the following description in which the embodiments of the invention as shown in the Figures are described in detail. In the Figures:

DETAILED DESCRIPTION OF THE PREFERRED EMBODIMENTS

Figure 1:
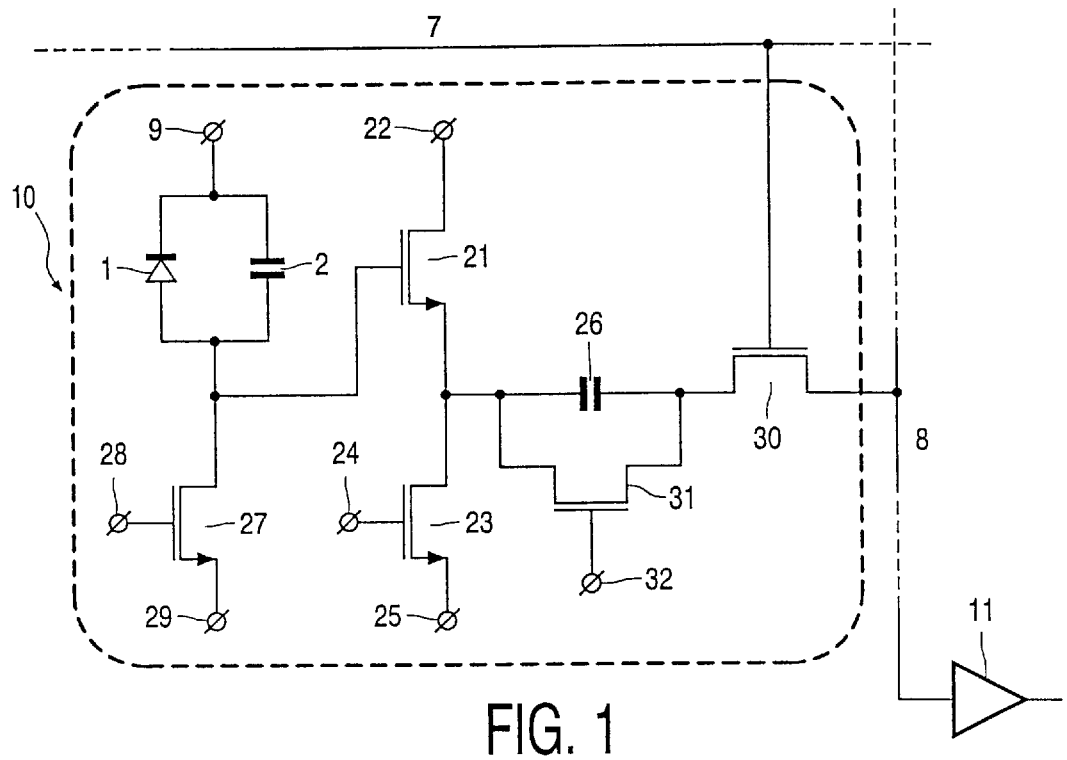
FIG. 1 shows a circuit diagram of a sensor element of a sensor matrix according to the invention.

FIG. 1 shows a sensor element 10 in the form of a conventional FDXD matrix cell 10 extended with the circuit according to the invention. Hundreds or thousands of such matrix cells 10 are arranged in rows and columns within a sensor.

Each matrix cell 10 includes first of all, as in customary FDXD matrix cells, a conversion element 1 with a storage capacitance 2 which may be intrinsically contained in the conversion element 1 or additionally built in.

The conversion element 1 and the storage capacitance 2 are connected on one side to a counter electrode 9 which is common to all matrix cells 10. Furthermore, each matrix cell 10 includes a read-out switching transistor 30 whose gate is connected to a switching line 7. The switching lines 7 are common to all matrix cells 10 of a matrix row. The output of the switching transistors 30 is connected to a read-out line 8, the matrix cells 10 of a column in the customary matrix detectors being provided with a respective common read-out line 8.

The matrix cells 10 are row-wise activated for reading out, via the switching lines 7, so that the individual matrix cells 10 of the relevant column are read out successively via each time the same read-out line 8. At the end of the read-out line 8 there is provided a charge-sensitive amplifier (CSA) 11.

In the conventional FDXD matrix cells known thus far the conversion element 1, or the storage capacitance 2, is connected directly to the input of the switching transistor 30. This means that no amplification takes place within the individual matrix elements.

In the sensor according to the invention the side of the conversion element 1, or the storage capacitance 2, which faces the counter electrode 9 is connected first of all to the gate of a source follower transistor 21.

At the source output of the source follower transistor 21 there is provided an additional transistor 23 which serves as an active load. Moreover, the output of the source follower transistor is connected to a sampling capacitor 26, the other side of which is connected to the input of the read-out switching transistor 30. The drain terminal 22 of the source follower transistor 21 may be common to all matrix cells 10 and be connected, for example, to the counter electrode 9. However, it may also be connected parallel to the switching line 7 so as to be horizontally common to all matrix cells 10 of a row.

Similarly, the gate terminal 24 and the source terminal 25 of the active load 23 may be common to all matrix cells 10 of a sensor or common to one row only. It is in principle also possible to connect the gate terminal 24 directly to the drain of the active load 23.

The source follower transistor 21 as well as the active load 23 should preferably operate in the saturation range of the relevant transistor characteristic, that is, the condition $V_{DS}>V_{GS}-V_t$ must be satisfied, where $V_{DS}$ is the drain source voltage, $V_{GS}$ is the gate source voltage and $V_t$ is the actual threshold voltage of the relevant transistor. The voltage transfer of the source follower transistor can then be described by the equation $V_S=V_G-V_{thr}$, where $V_{thr}$ is the effective threshold voltage which is dependent on the actual threshold voltage $V_t$ and the drain current $I_D$. $V_S$ is the voltage present at the source and $V_G$ is the voltage present at the gate of the source follower transistor 21.

A reset transistor 27 is connected to the output of the conversion element 1, or the storage capacitance 2, which faces the counter electrode 9; there is a reset transistor 27 which serves to bias the conversion element 1 and the parallel storage capacitance 2 to the off-load voltage $V_{GO}$. The source terminal 29 of the reset transistor 27 can be constructed so as to be common to all matrix cells 10 of the sensor. It is also possible to form the output 29 for all matrix cells 10 of a row, that is parallel to the switching line 7. The gate terminal 28 of the reset transistor 27 is preferably constructed so as to be common to all matrix cells 10 of a row.

Furthermore, the circuit also includes an optional discharging transistor 31 whose gate 32 is also connected, preferably via a horizontal line, so as to be common all matrix cells 10 of a row.

Figure 2:
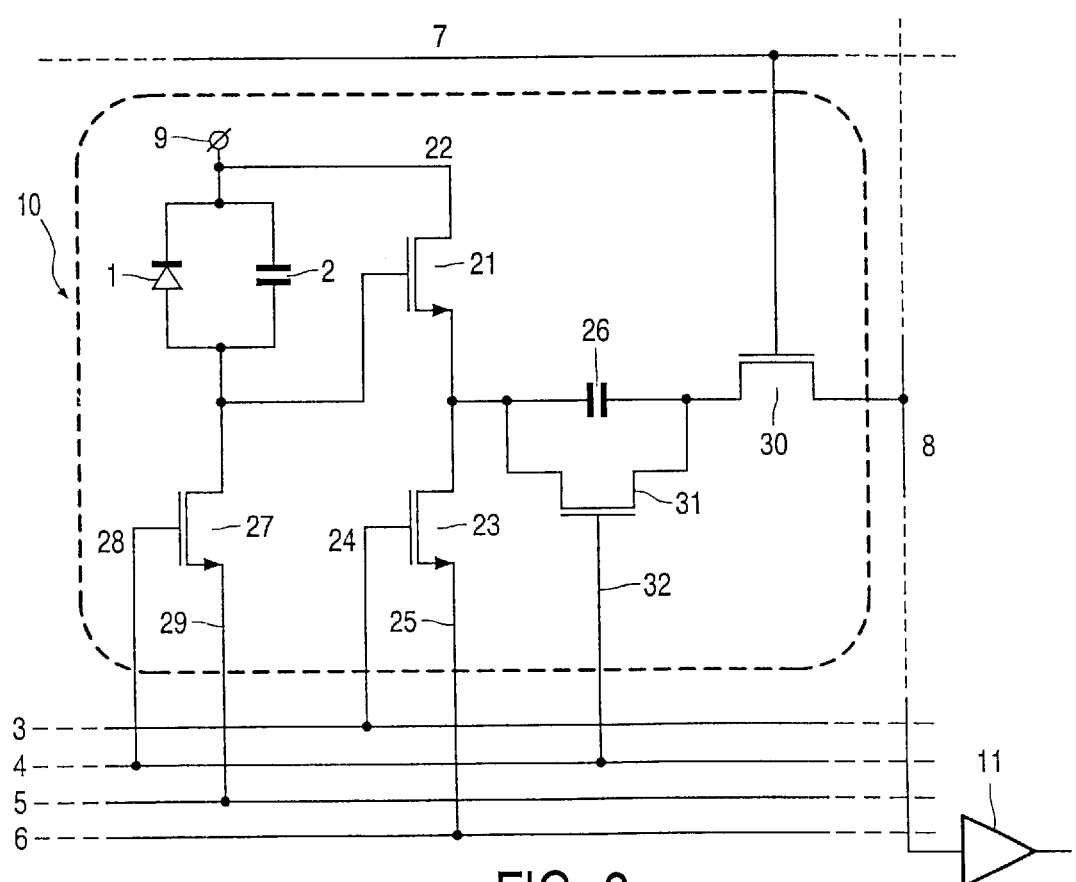
FIG. 2 shows the circuit diagram of FIG. 1 with the switching and supply lines leading tot he components in one embodiment.

FIG. 2 shows, by way of example, a circuit arrangement with four additional horizontal lines 3, 4, 5, 6, that is, lines which extend parallel to the switching line 7 and are common to all matrix cells 10 of a matrix row. A switching line 3 is connected to the gate of the active load 23. A further switching line 4 is connected to the gate 28 of the reset transistor 27 and the gate 32 of the discharging transistor 31. A third line 5 is connected to the source output 29 of the reset transistor 27 and a fourth line 6 is connected to the source output 25 of the active load 23.

All components shown are integrated in the matrix cells 10 by way of thin film technology. The transistors are made of amorphous silicon or polycrystalline silicon.

Figure 5:
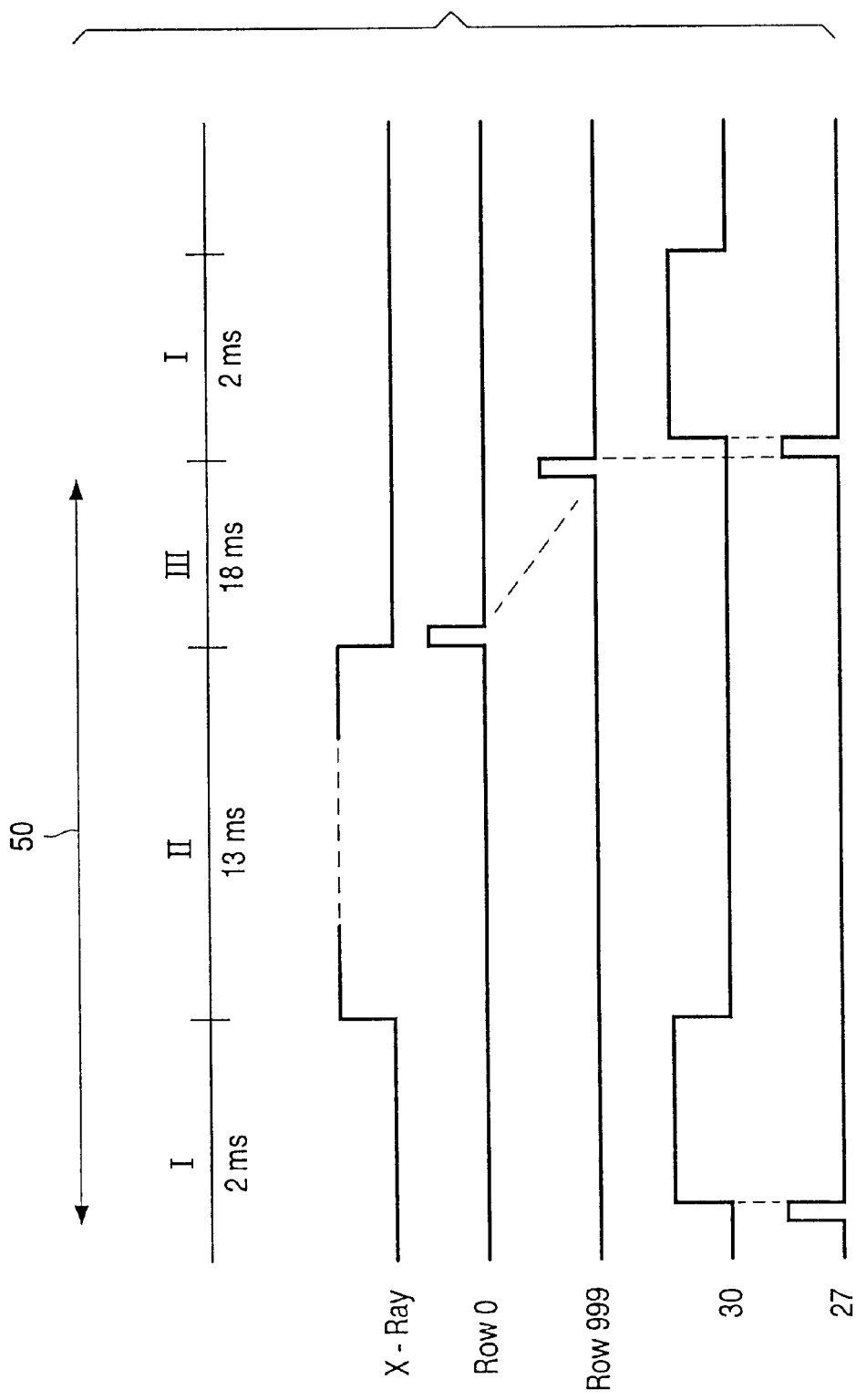
FIG. 5 shows diagrammatically a switching sequence during a measuring and read-out cycle in conformity with a third mode of operation.
Figure 6:
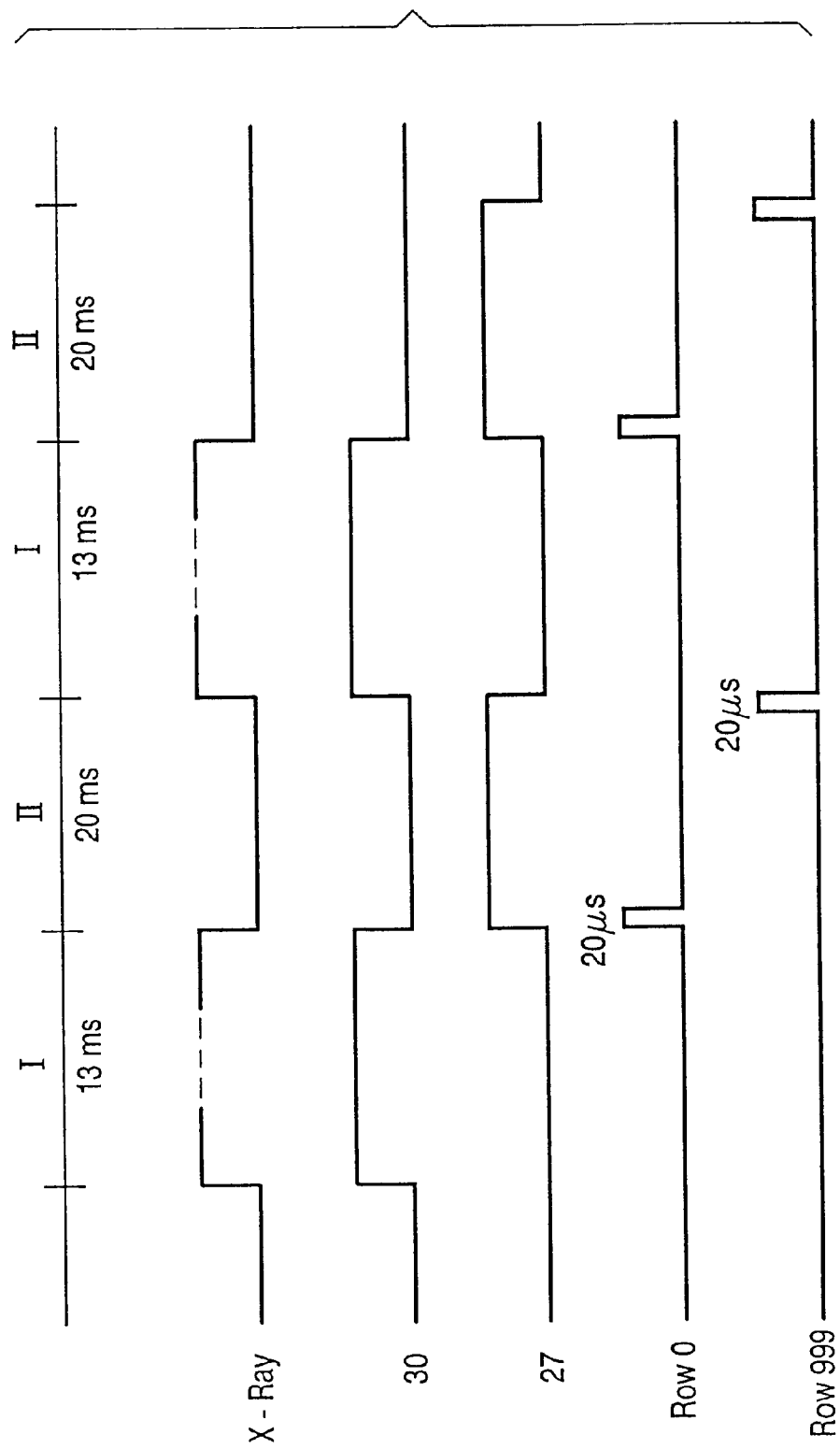
FIG. 6 shows diagrammatically a switching sequence during a measuring and read-out cycle in conformity with a fourth mode of operation.

Various preferred versions for operation of the proposed circuit will be described in detail hereinafter. To this end, reference is made to the respective switching sequences which are diagrammatically shown in FIGS. 3 to 6. The method shown in FIG. 4 utilizes double sampling while that shown in FIG. 3 utilizes correlated double sampling (CDS) within the relevant matrix cell 10. FIG. 5 shows a different operating scheme which ensures the sampling capacitor is fully prepared before read out of pixel data and FIG. 6 shows a method which enables Frame Transfer detector operation.

Figure 3:
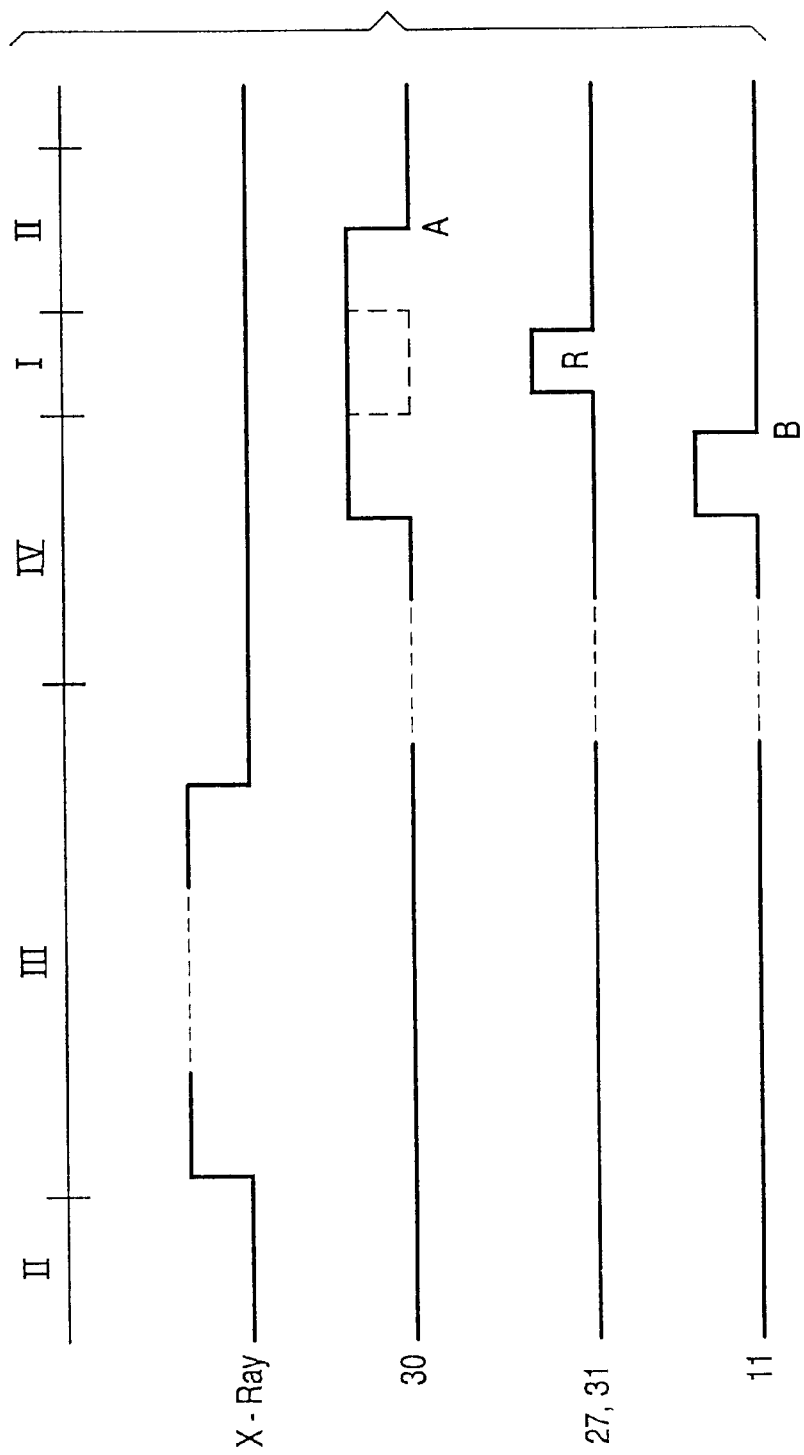
FIG. 3 shows diagrammatically a switching sequence during a measuring and read-out cycle in conformity with a first mode of operation.

FIG. 3 shows the mode of operation called "switching noise suppression". The top plot in FIG. 3 indicates the X-ray exposure time. The second plot shows when the read out switching transistor 30 is on or off. The third plot shows when the reset transistor 27 and the discharging transistor 31 are on and off, and the bottom plot shows when the amplifier 11 is active. During a first phase I, that is, the reset phase, the reset transistor 27 is active in the matrix cells 10 of the relevant row. As a result, the conversion element 1 and the parallel storage capacitance 2 of the magnitude $C_P$ are biased to the off-load voltage. The voltage $V_{G0}$ is then present at the gate of the source follower transistor 21.

In as far as the circuit does not include the optional discharging transistor 31, the read-out switching transistor 30 remains active during the entire reset phase I (solid line). In the embodiment which includes the optional discharging transistor 31 as shown in FIG. 1 and FIG. 2, the discharging transistor 31 is active simultaneously with the reset transistor 27 in the reset phase I so as to achieve accelerated discharging of the sampling capacitor 26 having the capacitance $C_S$. The read-out switching transistor 30 is preferably deactivated during the reset phase I (dotted line).

After the end of the first phase I, the read-out switching transistor 30 is active until an instant A in a second phase II. During this time the voltage $V_{G0}-V_{thr}$ is present at one side of the sampling capacitor 26 whereas at the other side the input voltage $V_{CSA}$ of the CSA 11 arises via the lowpass filter formed by the sampling capacitor 26 and the read-out switching transistor 30. The CSA 11 must be constructed in such a manner that its input voltage is always maintained at the constant value $V_{CSA}$, irrespective of the fact whether the integrator in the CSA is active or not. Customary CSAs satisfy this requirement. Thus, the voltage difference $V_{G0}-V_{thr}-V_{CSA}$ is maintained across the sampling capacitor 26 as from the opening of the read-out switching transistor 30 at the instant A; this voltage difference is representative of the reset conversion element 1. A "zero value" is thus quasi sampled.

The described reset operation in the first phase and the sampling of the relevant zero value in the second phase II are performed row-wise for all matrix cells 10 of the detector matrix. Subsequently, in the so-called X-ray window the entire detector matrix is exposed to X-rays during the third phase III. The charge carrier pairs then generated in the conversion element 1 of the relevant matrix cell 10 discharge the storage capacitance 2 of the magnitude $C_P$ by the signal charge $Q_P$, with the result that the voltage at the gate of the source follower transistor 21 increases to $V_{G1}=V_{G0}+(Q_P/C_P)$. The voltage $V_{G1}-V_{thr}$ then arises at the output of the source follower transistor 21, without the voltage difference across the sampling capacitor 26 being changed, because the read-out switching transistor 30 and the discharging transistor 31 are inactive.

During the subsequent fourth phase IV of the row-wise red-out operation, first the integrator of the CSA 11 is activated and briefly thereafter the read-out switching transistor 30 for each matrix row. Whereas the output of the source follower transistor 21 still carries the voltage $V_{G1}-V_{thr}$, the other side of the sampling capacitor 26 carries the input voltage of the CSA 11 again. At the instant B the integration in the CSA 11 is stopped. The voltage difference across the sampling capacitor 26 then amounts to $V_{G1}-V_{thr}-V_{CSA}$. Comparison with the voltage difference at the instant A reveals that the sampling capacitor 26 has been subject to a change of charge amounting to $Q_S=C_S*(V_{G1}-V_{G0})=C_S*Q_P/C_P$ during the integration time, that is, precisely only during this time. Therefore, exactly this charge $Q_S$ is measured as the result of the integration in the CSA 11. It is advantageous that the charge $Q_S$ exceeds the change of the $Q_P$ of the storage capacitance 2 by the charge amplification factor $G_Q=C_S/C_P$. At the instant B an operation cycle of the matrix cell 10 is terminated and the described first phase I can commence again. This is shown in FIG. 3.

The described mode of operation is also compatible with a continuous X-ray exposure mode. For reasons of clarity, however, pulsed X-ray exposure was chosen. The leakage currents which practically always flow in the conversion elements 1 have also been ignored for the purpose of simplicity. As in conventional FDXDs, the leakage currents in this mode of operation are contained in the measured charge signal. When photodiodes are used as the conversion element 1, it is to be noted that the capacitance $C_P$ is not constant but dependent on the charge $Q_P$, so that the transfer function contains a non-linear component.

The proposed solution has a particularly advantageous aspect which is formed by the stability of the transfer function of the circuit. This gain stability of the circuit is due to the fact that the source follower transistor 21 has a stable voltage amplification amounting to 1 which is converted into a charge amplification $G_Q=C_S/C_P$ by means of the sampling capacitor 26. The offset stability is obtained by subtraction of the relevant offset value from the overall value consisting of the signal and the offset value. As a result, all offset effects which are slower in time than the image repetition time $T_F$ are effectively eliminated. Due to the 1/F noise of the source follower transistors 21 and the active loads 23 used in the proposed circuit, additional noise may occur in this mode of operation. However, noise phenomena which are essentially slower than the image repetition rate $T_F$ are again eliminated by the CDS method.

As regards the switching noise it is to be noted that the measuring result is affected only by switching operations between and including the instants A and B. The reset operation for the conversion element 1 and the sampling capacitor 26 does not lie within this time interval and hence does not contribute to the noise. The opening of the read-out switching transistor 30 at the instant A makes a noise contribution which is a factor $G_Q^{1/2}$ larger than the switching noise of the known FDXD. However, this is opposed by the signal amplification factor $G_Q$, SO that overall the signal-to-noise ratio is improved by $G_Q^{1/2}$. The switching noise upon deactivation of the integration in the CSA 11 at the instant B does not make an additional contribution, because it also occurs in conventional FDXD and in this case loses significance in comparison with the signal because of the charge amplification $G_Q$.

Overall, this mode of operation leads to an enhanced signal-to-noise ratio when the charge amplification $G_Q$ is sufficiently high; this leads to a distinct enhancement of the image, notably in the case of X-ray exposures with a low dose (for example, fluoroscopy).

Figure 4:
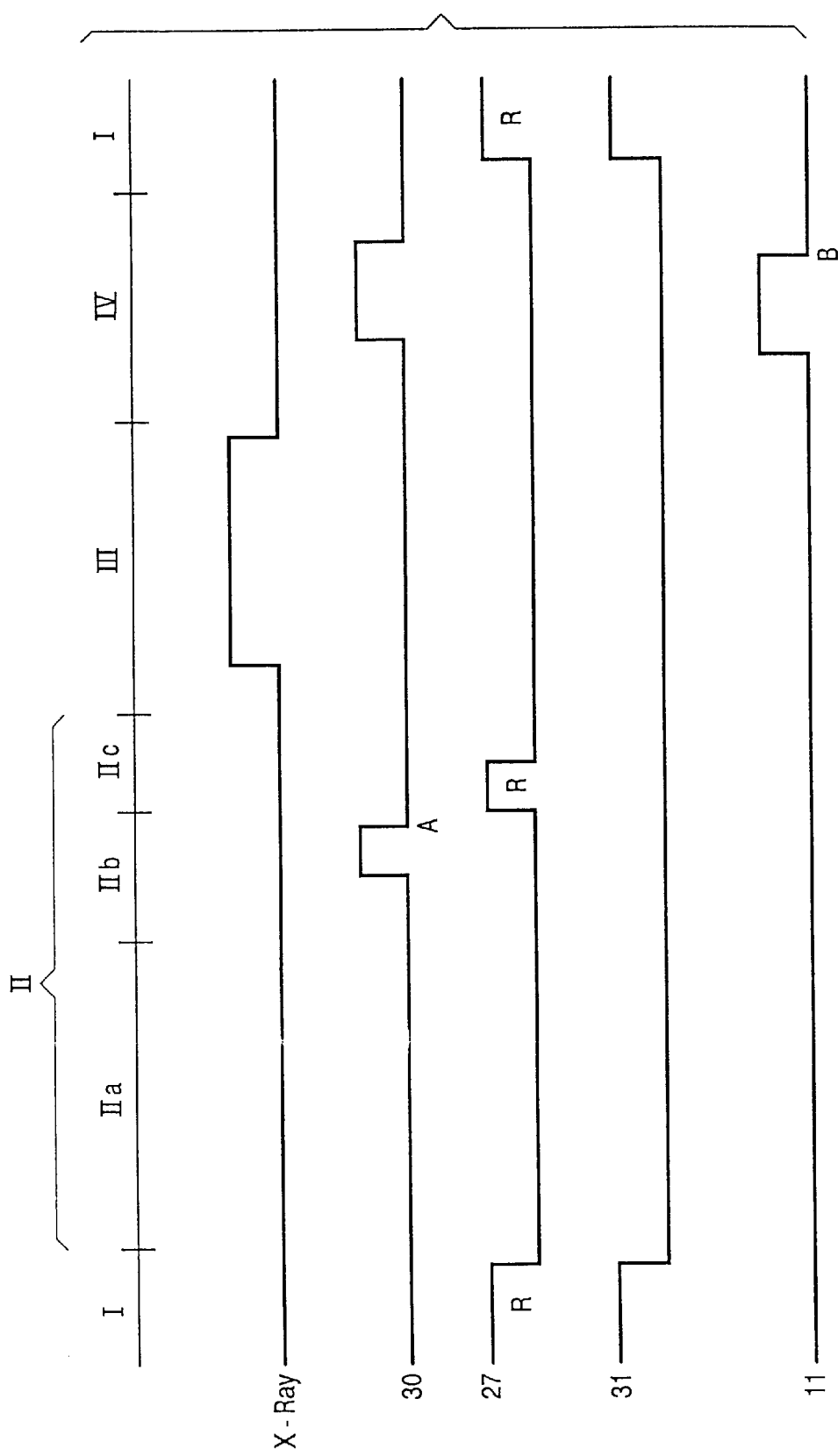
FIG. 4 shows diagrammatically a switching sequence during a measuring and read-out cycle in conformity with a second mode of operation.

The switching sequence for the second mode of operation, that is, the so-called dark current subtraction mode, is diagrammatically shown in FIG. 4. The top plot in FIG. 4 indicates the X-ray exposure time. The second plot shows when the read out switching transistor 30 is on or off. The third plot shows when the reset transistor 27 is on or off. The fourth plot shows when the discharging transistor 31 is on and off, and the bottom plot shows when the amplifier 11 is active. Like in the first mode of operation, in the first phase I first the conversion element 1, or the capacitance 2, and the sampling capacitor 26 are biased to the off-load voltage.

Subsequently, however, this value is not retained directly as the zero value on the sampling capacitor 26, but first a dark current is recorded on the conversion element 1 in a first sub-phase IIa. The dark current of the relevant conversion element 1 is then integrated.

Subsequently, in a second sub-phase IIb a voltage difference is adjusted across the sampling capacitor 26, that is, the dark image is sampled. This is realized by briefly activating of the read-out switching transistor 30.

After this first sampling in the sub-phase IIb, in the sub-phase IIc the conversion element 1 is reset, in this case neither the discharging transistor 31 nor the read-out switching transistor 30 is activated, so that the voltage difference adjusted across the sampling capacitor 26 during the first sampling operation is retained. When a discharging transistor 31 is used, of course, it must then be possible to switch the discharging transistor 31 and the reset transistor 27 via separate lines.

After such second resetting of the conversion element 1, the X-ray exposure takes place in the X-ray window. Reading out in the phase IV takes place like in the previously described "switching noise suppression" mode of operation.

Overall, according to this method the measured value obtained at the instant B after the integration in the CSA 11 is the charge $G_S=G_Q*(Q_P-Q_D)$ with the charge amplification factor $G_Q=C_S/C_P$ as in the first mode of operation. The charge $Q_D$ represents the dark current component integrated in the dark window. Therefore, the lengths of the dark window and the X-ray window, that is, the phases IIa and III, are preferably chosen to be the same, so that a measured value which has been corrected in respect of the dark current. The quantities $V_{thr}$ and $V_{CSA}$ no longer occur in the measured value, like in the previously described mode of operation, because they are also eliminated by the subtraction.

Overall, the advantage of the second mode of operation resides in the fact that the dark images which are produced mainly by leakage currents in the conversion elements 1 are subtracted already within the individual matrix cells 10. Furthermore, this second mode of operation also offers the advantages of a particularly advantageous stability of the transfer function of the circuit, that is, the gain stability and the offset stability as already achieved for the first mode of operation.

Because resetting of the conversion element 1 and the storage capacitance 2 takes place between the instants A and B within the third sub-phase IIc of the phase II, an additional noise component which is due to the reset noise must be taken into account. Therefore, the signal-to-noise ratio in the second mode of operation will be less than that in the first mode of operation.

The two modes described above each provide a reset operation of the conversion element 1 (phase I), followed by storage of a charge on the sampling capacitor 28 corresponding to the reset state of the conversion element 1 (phase II). This is repeated for each row.

A potential problem with this approach is that the pixel must be readout, reset and then the sampling capacitor 28 must be charged back to a steady state all within a short interval of about 20 $\mu$s. Assuming 10 $\mu$s is required for readout, then this leaves 5 $\mu$s each for the other two tasks. Using typical device parameters for a-Si and poly-Si TFTs there may be insufficient time for the sampling capacitor to be charged back to a steady state within 5 $\mu$s. Ideally, a time period of 50–100 $\mu$s is appropriate.

If the sampling capacitor 28 is not recharged to a steady state, charge offsets from the pixel are caused.

FIG. 5 is used to illustrate an alternative timing scheme in which the resetting operation is not carried out during the read out of the array. Instead, all pixels in the array are reset (photodiodes reset and sampling capacitor charged to steady state) in parallel before the X-ray exposure. A 2 ms time interval is allocated for this so that the sampling capacitor can be easily charged to a steady state.

For illustration only, the timing sequence of FIG. 5 assumes 30 KHz operation for a detector with a 1000×1000 array of pixels. This gives a frame time 50 of 33 ms. This may be divided in to an X-ray exposure time of 13 ms and a line readout time of 20 μs.

The array readout is divided into three phases I, II and III, discussed below. The top plot in FIG. 5 shows the X-ray exposure time. The next plot shows the read out pulse for the first row, and the next plot shows the read out pulse for the last row. The fourth plot shows the state of the read out switching transistor 30 and the bottom plot shows the state of the reset transistor 27.

Phase I

This is the 2 ms reset phase during which the sampling capacitor is charged to the steady state value. At the start of the reset stage all of the reset transistors 27 are closed. The photodiode charge is reset and the gate of the source follower transistor 21 is fixed at the $V_{GO}$ DC potential. The source of the source follower transistor 21 will reach the steady state voltage $V_{GO}-V_{thr}$. Next, the reset transistors 27 open and the read out switching transistors 30 close. The voltage on one plate (the top plate) of the sampling capacitor 26 is fixed at the source voltage and other plate voltage is set to the column potential on the read out line 8. Therefore, the charge on the sampling capacitor 26 is constant at the end of the reset phase. Assuming that the column potential is OV, then the charge on capacitor 26 can be expressed as:

$$Q_O = C_S \times V_{SO}$$

where $C_S$ is the capacitance of the sampling capacitor, and $V_{SO}$ is the initial (quiescent) value of the source voltage of the source follower transistor 21 (equal to $V_{GO}-V_{thr}$).

Phase II

The signal exposure window follows the resetting stage. During this time, photons incident onto the photodiode will generate a photocurrent to discharge the photodiode capacitance. This results in a linear increase in the gate voltage. As described above, the active load ensures that the source voltage follows the gate voltage to maintain a constant gate-source voltage. If the change in gate voltage during the exposure was $\Delta V_{pd}$, then the final value of source voltage $V_{S1}$ will be:

$$V_{S1} = V_{S0} + \Delta V_{pd}$$

During the exposure time, the charge on capacitor 26 remains constant since the read out switching transistor 30 is open Phase III The final stage in the readout sequence is the line by line readout. During readout, the read out switching transistors 30 of all pixels in a row are closed and the sampling capacitor 26 is charged to the new value of the source voltage. The pulses may last 18 μs. The charge on the sampling capacitor at the end of the readout will be:

$$Q_1 = C_S \times V_{S1} = C_S \times (V_{S0} + \Delta V_{pd})$$

During the readout period, the amplifier samples the change in charge across capacitor 26 as given below:

$$\Delta Q_C = Q_1 - Q_0 = C_S \times \Delta V_{pd}$$

This can be rewritten as:

$$\Delta Q_C = \frac{C_S}{C_P} \times \Delta Q_{pd}$$

where $\Delta Q_{pd}$ is the change in photodiode charge during an exposure, and the term $C_S/C_P$ is the pixel gain.

By separating the pixel resetting from the array readout phase, this scheme provides sufficient time for the sampling capacitor to reach a steady state which eliminates the pixel offset error charge. Furthermore, the pixel readout time can almost be doubled from for example 10 μs to 18 μs and this increases the time to read the pixel signal.

FIG. 6 shows a further drive scheme that provides Frame Transfer Operation. There is a desire to find a solution for operating X-ray detectors in bi-plane cardio applications. Such applications uses two detectors orthogonally positioned and two X-ray sources operating at fast frame rates (60 Hz). The X-ray sources are pulsed sequentially so that a first detector detects a dose from a first source and then the second detector detects a dose from the second source. However, some of the scattered dose from one source will be incident onto the detector intended for the other source. Therefore when the first detector is being readout, the scattered X-rays from the second source will alter the photodiode signal and hence image that is been read. Consequently it is necessary that during readout, the first detector is insensitive to X-rays from the second source and the second detector is insensitive to X-rays from the first source. This mode of detector operation is called Frame Transfer. It literally means that during the exposure, the pixel data is "stored/transferred" onto a storage device within the pixel. After the exposure, the storage device is read and any signal on the photodiodes from scattered X-rays will not effect the signal being readout.

In the conventional X-ray detector, in which the pixels comprise a TFT and photodiode, the detector is exposed to an X-ray dose and then each line is readout in turn. The readout process resets the pixels so that at the end of the readout period, the array is reset. Therefore, after the exposure, the detector is still sensitive to X-rays until the entire array has been read. For this reason, the standard detector does not provide Frame Transfer operation.

A modified readout technique can provide the frame transfer operation, and the timing scheme is shown in FIG. 6. Again, the readout sequence comprises an exposure (phase I) followed by a series of line readouts (phase II). The top plot in FIG. 6 shows the X-ray exposure time. The second plot shows the state of all read out switching transistors 30 and the next plot shows the state of all reset transistors 27. The next plot shows two read out pulses for the first row, and the last plot shows two read out pulses for the last row.

In this timing arrangement, during the exposure (phase I), the change in source voltage of the source follower transistor 21 is transferred immediately to the storage capacitor. For this purpose, all the read out switching transistors are closed during exposure, so that the sampling capacitors will be charged to the source voltage during exposure.

Assume that the gate voltage at the end of the exposure is:

$$V_{G1} = V_{G0} + \Delta V_{pd}$$

and that the source voltage is:

$$V_{S1} = V_{bias} + \Delta V_{pd}$$

where $\Delta V_{pd}$ is the change in source follower gate voltage during an exposure, $V_{G0}$ is the DC voltage on the source follower gate at the start of the exposure and $V_{bias}$ is the quiescent voltage on the source node. Therefore, the charge stored on the sampling capacitor is:

$$Q_C = C_S \times V_{S1} = C_S \times (V_{bias} + \Delta V_{pd})$$

After the exposure period, all of the read out switching transistors 30 open and the reset transistors close. The source follower gate and source nodes are reset to $V_{G1}$ and $V_{bias}$. Since the reset transistors 27 remain on during the readout period, the photodiode charge remains constant. Therefore, X-rays incident on the detector after the exposure time will not alter the signal being readout through the sampling capacitors so that Frame Transfer operation is possible.

During the readout period, each read out switching transistor is sequentially addressed. During this time, the sampling capacitor in an addressed pixel will be charged to the quiescent source voltage ($V_{bias}$). Therefore, the change in charge during readout is:

$$\Delta Q_C = C \times \Delta V_{pd}$$

$$\Rightarrow \Delta Q_C = C_S/C_P \times \Delta Q_{pd}$$

and this charge is detected by the amplifier.

Thus, the pixel can be used to provide frame transfer mode of operation and maintain pixel gain with a gain of $C_S/C_P$. Alternatively, the sampling capacitor could have the same value as $C_P$ so there would be frame transfer without gain.

Finally, it is also to be noted again that all of said advantages are achieved by means of comparatively few additional components in the individual sensor cells and without taking additional process steps during the production. Therefore, the manufacture of such sensors according to the invention is hardly more expensive than the manufacture of sensors commercially available thus far.

What is claimed is:

1. A sensor with a plurality of sensor elements (10), each of which includes a radiation-sensitive conversion element (1) which generates an electric signal in dependence on the incident radiation, and also with means (21 to 26) for amplifying the electric signal in each sensor element (10) and a read-out switching element (30) in each sensor element (10) which is connected to a read-out line (8) in order to read out the electric signal, characterized in that the means for amplifying include a respective source follower transistor (21) whose gate is connected to the conversion element (1), whose source is connected to an active load (23) and to one side of a sampling capacitor (26), the other side of the sampling capacitor (26) being connected to the read-out line (8) via the read-out switching element (30), and that a respective reset element (27) is connected to the conversion element (1) to reset the conversion element (1) to an initial state.

2. A sensor as claimed in claim 1, characterized in that
a discharge switching element is connected parallel to the sampling capacitor.

3. A sensor as claimed in claim 1 or 2, characterized in that
the active load and/or the read-out switching element and/or the reset element and/or the discharge switching element include transistors.

4. A sensor as claimed in claim 2, characterized in that
the reset element and the discharge switching element have a common switching line or separate switching lines for activating the relevant element.

5. A sensor as claimed in claim 2, characterized in that
a plurality of sensor elements have a common switching line for activating their read-out switching elements, and that these sensor elements also include common switching lines or a common switching line for activating their reset elements and/or their discharge switching elements.

6. An X-ray examination apparatus, including an X-ray source for emitting an X-ray beam for irradiating an object so as to form an X-ray image, as well as a detector for generating an electric image signal from said X-ray image, characterized in that an X-ray detector includes a sensor as claimed in claim 1.

7. A method of operating a sensor having a plurality of sensor elements, each of which includes a radiation-sensitive conversion element which generates an electric signal in dependence on the incident radiation, a reset element which resets the conversion element to an initial state, and a source follower transistor whose source is connected to an active load and to one side of a sampling capacitor whose other side is connected, via a read-out switching element, to a read-out line for reading out the electric signal, wherein:

during a measuring and read-out cycle in each sensor element the conversion element and the sampling capacitor are reset to an initial state during a first phase, a voltage difference which is representative of the conversion element in the initial state is adjusted across the sampling capacitor during a second phase, the voltage across the sampling capacitor is sustained during a third phase while the conversion element is irradiated by means of a radiation source, and during a fourth phase the voltage difference across the sampling capacitor is adjusted to a value which is representative of the conversion element after the irradiation, the variation of the potential at the side of the sampling capacitor which is connected to the read-out line being measured as a measure of the radiation incident on the conversion element.

8. A method as claimed in claim 7, wherein
within the second phase first a dark current is recorded on the conversion element in a first sub-phase, and that subsequently there is a second sub-phase in which a voltage difference is adjusted across the sampling capacitor, which voltage difference corresponds to a reference state of the conversion element after the recording of the dark current, and that subsequently in a third sub-phase the conversion element is reset to its initial state while the voltage difference across the sampling capacitor is maintained.

9. A method as claimed in claim 7 or 8, wherein
the adjustment of the voltage difference across the sampling capacitor in the second and the fourth phase takes place by activation of the read-out switching element, and that the read-out switching element is deactivated in order to sustain the voltage difference.

10. A method as claimed in claim 7, wherein
the sampling capacitor is reset by activation of a discharge switching element connected parallel to the sampling capacitor.

11. A method as claimed in claim 7, wherein
a measuring and read-out cycle is controlled for a plurality of sensor elements in common via common switching lines.

12. A method of operating a sensor having a plurality of sensor elements arranged in rows and columns, each of which includes a radiation-sensitive conversion element which generates an electric signal in dependence on the incident radiation, a reset element which resets the conversion element to an initial state, and a source follower transistor whose source is connected to an active load and to one side of a sampling capacitor whose other side is connected, via a read-out switching element, to a read-out line for reading out the electric signal, the method comprising:

resetting the radiation-sensitive element and charging the sampling capacitor of each pixel to a known voltage;

exposing the sensor to radiation, the radiation-sensitive conversion element causing the voltage on the one side of the sampling capacitor to vary, wherein the read-out switching element is open during the exposure, providing an open circuit at the other side of the sampling capacitor, thereby maintaining a constant charge on the sampling capacitor; and closing the read out switching elements and charging the sampling capacitor for each pixel in a row to the voltage on the one side of the sampling capacitor, the amount of charge required being measured.

13. A method of operating a sensor having a plurality of sensor elements arranged in rows and columns, each of which includes a radiation-sensitive conversion element which generates an electric signal in dependence on the incident radiation, a reset element which resets the conversion element to an initial state, and a source follower transistor whose source is connected to an active load and to one side of a sampling capacitor whose other side is connected, via a read-out switching element, to a read-out line for reading out the electric signal, the method comprising:

exposing the sensor to radiation with the read-out switching elements closed, the radiation-sensitive conversion element causing a change in the voltage on the one side of the sampling capacitor and the read out line holding the other side of the sampling capacitor to a constant voltage;

closing the reset elements to and opening the read out switching elements, thereby holding the conversion element to a constant state irrespective of the incident radiation;

closing the read out switching elements of each row in turn and measuring the charge stored on the sampling capacitors for each row in turn.

* * * * *